United States Patent [19]
Reinberg

[11] Patent Number: 6,087,689
[45] Date of Patent: Jul. 11, 2000

[54] MEMORY CELL HAVING A REDUCED ACTIVE AREA AND A MEMORY ARRAY INCORPORATING THE SAME

[75] Inventor: Alan R. Reinberg, Boise, Id.

[73] Assignee: Micron Technology, Inc., Boise, Id.

[21] Appl. No.: 08/876,454

[22] Filed: Jun. 16, 1997

[51] Int. Cl.$^7$ .................... H01L 27/108; H01L 29/788
[52] U.S. Cl. .................... 257/296; 257/314; 257/316
[58] Field of Search .................... 257/296, 314–324, 257/2–5, 397; 365/96–100, 163

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |

(List continued on next page.)

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

(List continued on next page.)

*Primary Examiner*—Minh Loan Tran
*Assistant Examiner*—Cuong Quang Nguyen
*Attorney, Agent, or Firm*—Fletcher, Yoder & Van Someren

[57] ABSTRACT

There is disclosed a memory cell having a reduced active area. The memory cell may be incoporated into a memory array. A method of fabricating the memory cell and the memory array includes the fabrication of an access device, such as a diode, that protrudes above the semiconductor substrate. The memory element, such as a memory element formed of chalcogenide material, is disposed on the side of the protrusion to reduce the active area of the memory element as compared with conventional memory elements.

11 Claims, 3 Drawing Sheets

U.S. PATENT DOCUMENTS

| | | | |
|---|---|---|---|
| 4,272,562 | 6/1981 | Wood | 427/87 |
| 4,458,260 | 7/1984 | McIntyre et al. | 357/30 |
| 4,499,557 | 2/1985 | Holmberg et al. | 365/163 |
| 4,502,208 | 3/1985 | McPherson | 29/584 |
| 4,569,698 | 2/1986 | Feist | 148/1.5 |
| 4,630,355 | 12/1986 | Johnson | 29/575 |
| 4,642,140 | 2/1987 | Noufi et al. | 148/6.24 |
| 4,666,252 | 5/1987 | Yaniv et al. | 350/333 |
| 4,677,742 | 7/1987 | Johnson | 29/591 |
| 4,757,359 | 7/1988 | Chiao et al. | 357/23.5 |
| 4,795,657 | 1/1989 | Formigoni et al. | 427/96 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,293,335 | 3/1994 | Pernisz et al. | 365/148 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky et al. | 257/3 |
| 5,363,329 | 11/1994 | Troyan | 365/184 |
| 5,414,271 | 5/1995 | Ovshinsky et al. | 257/3 |
| 5,510,629 | 4/1996 | Karpovich et al. | 257/50 |
| 5,534,711 | 7/1996 | Ovshinsky et al. | 257/3 |
| 5,534,712 | 7/1996 | Ovshinsky et al. | 217/3 |
| 5,536,947 | 7/1996 | Klersy et al. | 257/3 |
| 5,687,112 | 11/1997 | Ovshinsky | 365/163 |
| 5,714,768 | 2/1998 | Ovshinsky et al. | 257/40 |
| 5,714,795 | 2/1998 | Ohmi et al. | 257/530 |
| 5,751,012 | 5/1998 | Wolstenholme et al. | 257/5 |
| 5,789,758 | 8/1998 | Reinberg | 257/3 |
| 5,812,441 | 9/1998 | Manning | 365/100 |
| 5,814,527 | 9/1998 | Wolstenholme et al. | 438/5 |
| 5,841,150 | 11/1998 | Gonzalez et al. | 257/3 |

OTHER PUBLICATIONS

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

MEMORY CELL HAVING A REDUCED ACTIVE AREA AND A MEMORY ARRAY INCORPORATING THE SAME

BACKGROUND OF THE INVENTION

1. Field of the Invention

The present invention relates generally to the manufacture of semiconductor memory devices and, more particularly, to the formation of memory cells having active areas of reduced cross-sectional size.

2. Background of the Related Art

Memory devices are integrated circuits that store information, typically for use by a microprocessor. A memory device can have a plurality of memory arrays, and each memory array can include hundreds of thousands of memory cells. Each memory cell generally includes a memory element and an access device coupled to the memory element. The memory cell may store information by storing a charge or by changing resistivity.

Chalcogenide materials recently have been proposed to form memory elements in memory devices. Chalcogenides are materials which may be electrically stimulated to change states, from an amorphous state to a crystalline state, for example, or to exhibit different resistivities while in the crystalline state. Thus, chalcogenide memory elements can be utilized in memory devices for the storage of binary data, and the storage of data represented in higher-based systems has also been proposed. Such memory cells may be accessed by applying a voltage potential across selected word lines and digit lines, in a manner similar to that conventionally utilized in memory devices. In one exemplary implementation suitable for use in a RAM, the access device may be a diode.

U.S. Pat. No. 5,335,219 is believed to be generally illustrative of the existing state of the art relative to chalcogenide materials, and it is believed to provide explanations regarding the current theory of function and operation of chalcogenide elements and their use in memory cells. The specification of U.S. Pat. No. 5,335,219 to Ovshinsky et al., issued Aug. 2, 1994, is incorporated herein by reference, for all purposes.

An observed property of a chalcogenide element in a memory cell is that the chalcogenide element will have an "active area" which may be less than the area of the entire chalcogenide element. The size of this active area can be controlled by controlling the size of electrodes that contact each side of the chalcogenide element or by controlling the size of the chalcogenide element itself. A primary reason for limiting the active area of a memory element is that, since the chalcogenide memory elements depend on current density to change states, the size of the active area is directly related to the programming current and/or time required to achieve the desired state change. Thus, in the interest of optimally fast programming rates of a memory device, it is desirable to minimize the dimensions of the active area.

Conventional techniques for forming the memory element and the electrode have included forming an aperture or cavity in a dielectric layer, and then depositing a conductive material (for the electrode) or an active material (for the memory element) in the aperture. Techniques for forming the aperture have included the application of a high current pulse to open a hole having a diameter on the order of 0.1 to 0.2 microns. Additional proposals have been made to utilize small-feature photolithography or etching techniques to establish an opening through the dielectric layer. Apertures having diameters of less than 0.2 microns can be formed photolithographically, but only with great difficulty. All of these methods suffer from technological constraints upon the aperture size, and they may offer less than optimal repeatability.

Co-pending patent application Ser. No. 08/486,635, describes a novel method for the formation of small electrodes. The method includes the use of a cylindrically shaped spacer to reduce the cross-sectional area of the electrode aperture, thereby minimizing the contact area of the electrode and the active area of the memory element. Under this method, the actual value of the cross-sectional area of the electrode depends both on the accuracy of the initial hole size and the accuracy of the sidewall spacer deposition. An alternative approach would be desirable which would facilitate forming a memory element while minimizing the relevance of such processing constraints.

The present invention may be directed to one or more of the concerns discussed above.

SUMMARY OF THE INVENTION

In accordance with one aspect of the present invention there is provided a memory cell. The memory cell includes an access device that is formed on a semiconductor substrate. The access device has a protrusion extending from the semiconductor substrate. A first layer of conductive material is disposed adjacent the protrusion to form a first electrode. A layer of structure changing material is disposed on the first electrode. A second layer of conductive material is disposed on the layer of structure changing material to form a second electrode.

In accordance with another aspect of the present invention, there is provided a memory cell. The memory cell includes a semiconductor substrate having a doped region. A doped semiconductive structure is disposed on the semiconductor substrate. The doped semiconductive structure has a sidewall that is positioned adjacent the doped region so that the doped semiconductive structure partially overlaps the doped region to create a diode. A layer of insulating material is disposed on the sidewall. A first layer of conductive material is disposed on the doped region adjacent the insulating material to form a first electrode. A layer of structure changed material is disposed on the first electrode. A second layer of conductive material is disposed on the layer of structure changing material to form a second electrode.

In accordance with still another aspect of the present invention, there is provided a memory array. The memory array includes a plurality of memory cells. Each memory cell includes an access device that is formed on a semiconductor substrate. The access device has a protrusion that extends from the semiconductor substrate. A layer of insulating material is disposed on the sidewall. A first layer of conducting material is disposed on the doped region adjacent the insulating material to form a first electrode. A layer of structure changing material is disposed on the first electrode. A second layer of conductive material is disposed on the layer of structure changing material to form a second electrode. The memory array also includes a grid that is coupled to the plurality of memory cells. The grid is formed by a first plurality of conductive lines that generally extend in a first direction and a second plurality of conductive lines that generally extend in a second direction.

In accordance with yet another aspect of the present invention, there is provided a memory array. The memory array includes a plurality of memory cells. Each memory cell includes a semiconductor substrate having a doped region. A doped semiconductive structure is disposed on the semiconductor substrate. The doped semiconductive structure has a sidewall that is positioned adjacent the doped region so that the doped semiconductive structure partially overlaps the doped region to create a diode. A first layer of conductive material is disposed on the sidewall of the doped semiconductive structure to form a first electrode. A layer of structure changing material is disposed on the first electrode. A second layer of conductive material is disposed on the layer of structure changing material to form a second electrode. The memory array further includes a grid that is coupled to the plurality of memory cells. The grid is formed by a first plurality of conductive lines generally extending in a first direction and a second plurality of conductive lines generally extending in a second direction.

In accordance with a further aspect of the present invention, there is provided a method of fabricating a memory cell. The method includes the steps of: (a) forming an access device on a semiconductor substrate, so that the access device has a protrusion that extends from the semiconductor substrate; (b) depositing a layer of insulating material on the protrusion; (c) depositing a first layer of conductive material on the protrusion to form a first electrode; (d) depositing a layer of structure changing material on the first electrode; and (e) depositing a second layer of conductive material on the layer of structure changing material to form a second electrode.

In accordance with an even further aspect of the present invention, there is provided a method of fabricating a memory array. The method includes the steps of: (a) forming a plurality of access devices on a semiconductor substrate, so that each of the plurality of access devices has a protrusion that extends from the semiconductor substrate; (b) forming a first plurality of conductive lines, so that each of the first plurality of conductive lines is coupled to respective access devices; (c) depositing a first layer of conductive material adjacent each of the protrusions to form a plurality of first electrodes; (d) depositing a layer of structure changing material on each of the plurality of first electrodes; (e) depositing a second layer of conductive material on the layer of structure changing material to form a plurality of second electrode; and (f) forming a second plurality of conductive lines, so that each of the second plurality of conductive lines is coupled to respective second electrodes.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
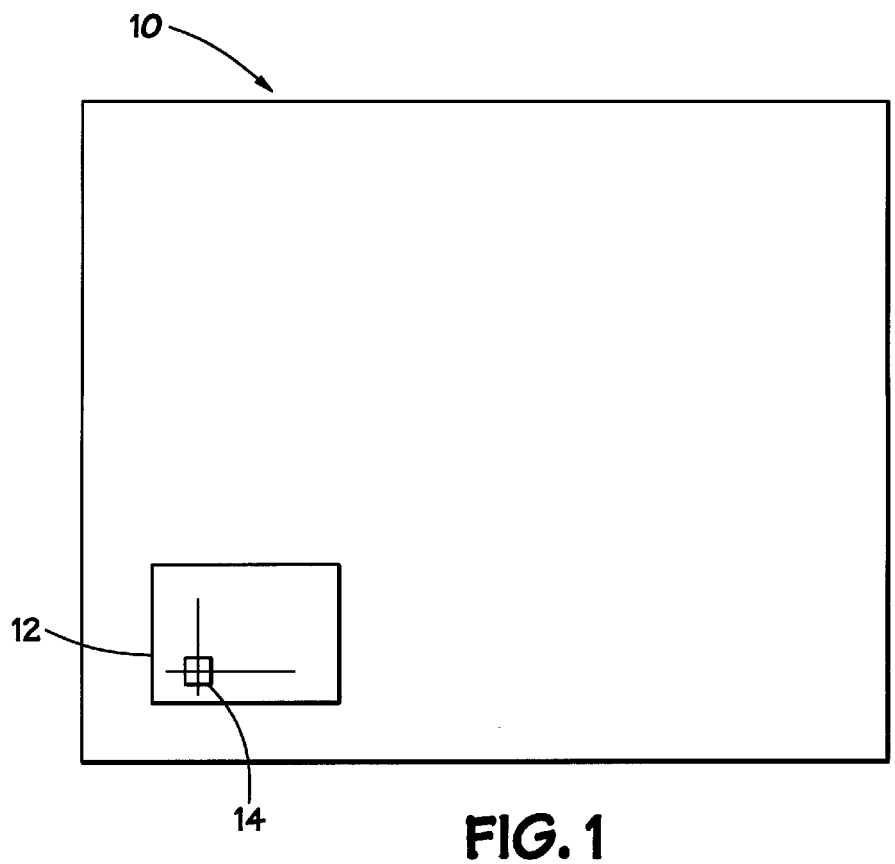
FIG. 1 is a schematic representation of an exemplary memory device including a plurality of memory arrays, one of which is illustrated.
Figure 2:
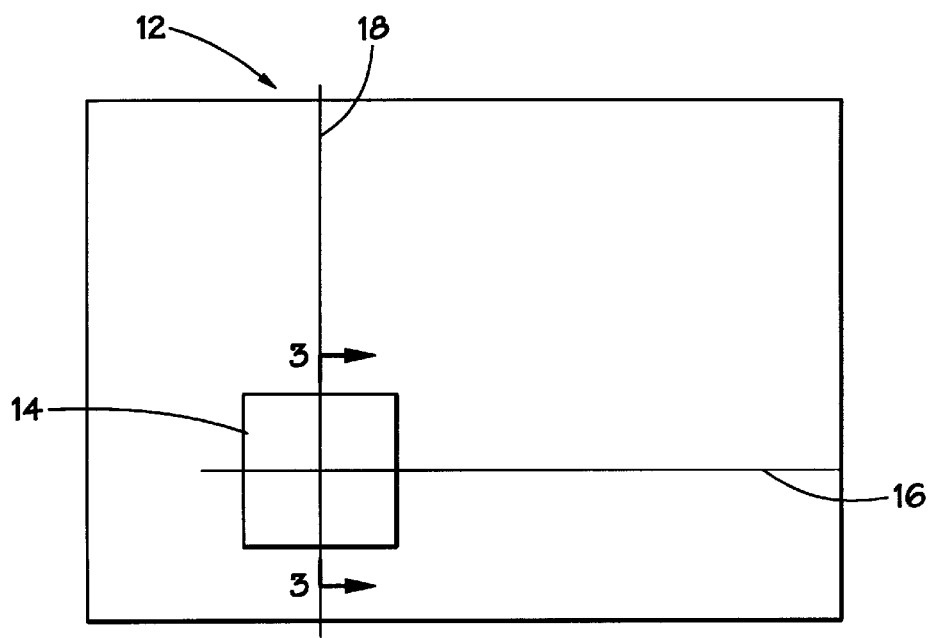
FIG. 2 is a schematic representation of a portion of one of the memory arrays of FIG. 1, including a memory cell manufactured in accordance with the present invention.

Turning now to the drawings, and referring initially to FIG. 1, a memory device is illustrated and generally designated by a reference numeral 10. The memory device 10 includes a plurality of memory arrays 12, one of which is illustrated. Each memory array 12 includes a plurality of memory cells 14, one of which is illustrated in FIG. 2. The memory cells 14 are arranged in rows and columns. Memory cells 14 in each row are connected by a respective row line 16, and memory cells 14 in each column are connected by a respective column line 18. Each memory cell 14 can be accessed for reading or writing by selecting the corresponding row and column coordinates and applying the appropriate voltage or current signal.

Figure 3:
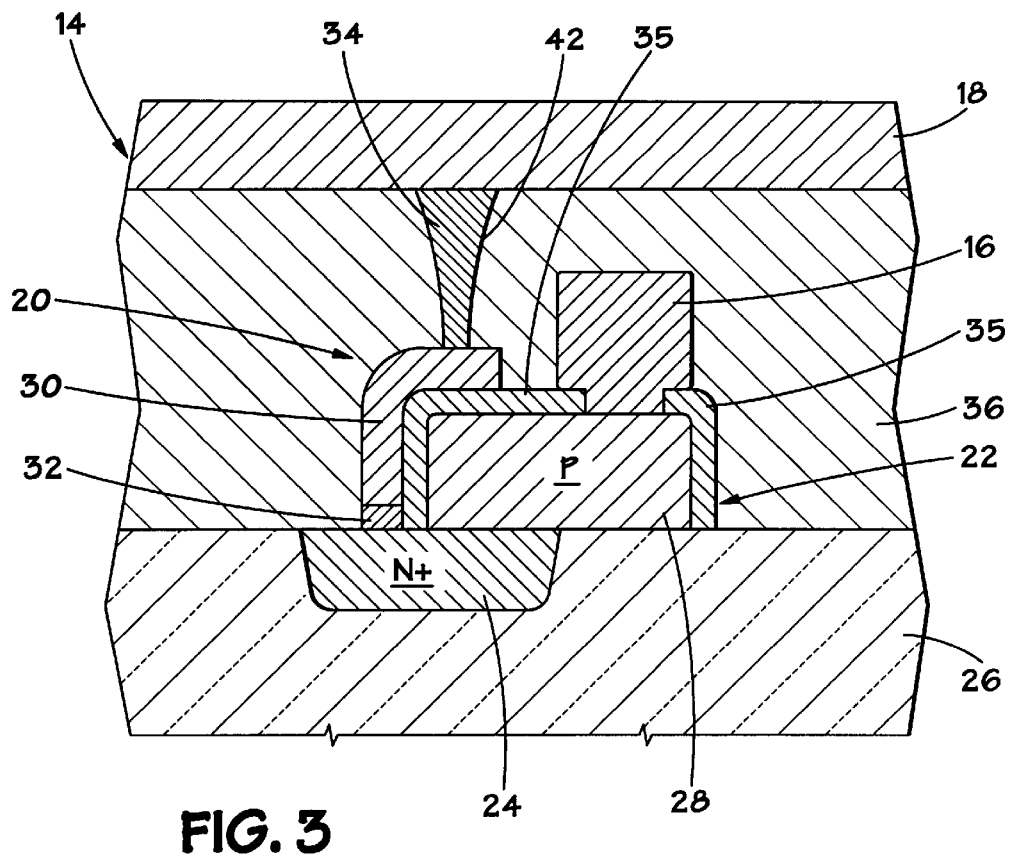
FIG. 3 depicts a memory cell in accordance with the present invention, illustrated in vertical section.

FIG. 3 illustrates an exemplary memory cell 14. The memory cell 14 includes a memory element 20 coupled to an access device 22. The memory element 20 and the access device 22 are coupled between a respective row line 16 and a respective column line 18. The access device 22 is a diode formed by the junction of an N+ region 24 (which is formed in a P-type substrate 26) and a P-type region 28, which is formed over the N+ region 24 and the substrate 26. Specifically, the P region 28 is formed as a mesa-shaped structure which may be about 500 Angstroms in height, for instance.

The memory element 20 includes a chalcogenide element 30 that is sandwiched between two electrodes 32 and 34. As can be seen from FIG. 3, the electrode 32 is formed over a portion of the N+ region 24. The chalcogenide element 30 is formed over the electrode 32 and over a portion of the mesa-shaped P region 28. However, it should be noted that an insulating layer 35 is disposed between the mesa-shaped P region 28 and the chalcogenide element 30 to isolate the chalcogenide element 30 from the mesa-shaped P region 28. The electrode 34 is a plug electrode that couples the chalcogenide element 30 to the column line 18. Of course, a dielectric layer 36 surrounds the structure to prevent undesirable electrical contact.

Figure 4:
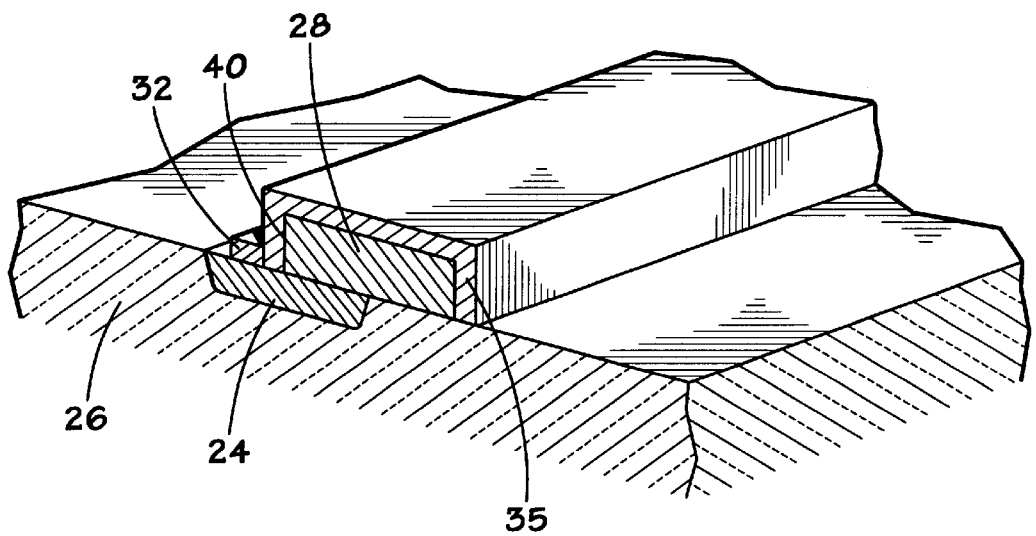
FIG. 4 depicts a semiconductor structure including a vertical wall, illustrated from an oblique view.

The formation of the memory cell 14 illustrated in FIG. 3 will now be described with reference to FIGS. 4–7. Unless otherwise noted, conventional photolithographic, etching, and deposition techniques may be used to fabricate the memory cell 14. To form the memory cell 14, an N+ trench 24 is formed in the substrate 26, as illustrated in FIG. 4. The mesa-shaped P region 28 is formed over a portion of the N+ region 24 and over a portion of the surface of the substrate 26. The mesa-shaped P region 28 is aligned so that an edge or sidewall 40 is positioned over the N+ region 24. Advantageously, the P-type region 28 is formed epitaxially of single crystal silicon and then doped appropriately. The junction between the N+ region 24 and the P region 28 forms a diode which acts as an access device 22 for the memory cell 14.

FIG. 4 also illustrates that the insulating layer 35 is deposited over the mesa-shaped P region 28. The electrode 32 is deposited alongside the mesa-shaped P region 28 over a portion of the N+ region 24. The electrode 32 is preferably a conductive material, such as titanium, tungsten, or an associated nitride. The electrode 32 may also be multi-layered. For instance, it may include a barrier layer of carbon to reduce undesirable migration between the N+ region 24 and the chalcogenide element 30.

Figure 7:
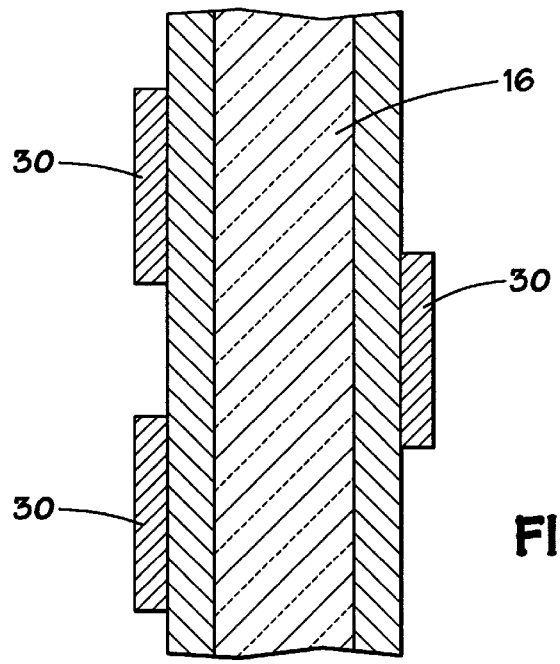
FIG. 7 depicts the semiconductor structure of FIG. 6 after patterning of the vertical portions of the chalcogenide layer, illustrated from a top plan view.
Figure 5:
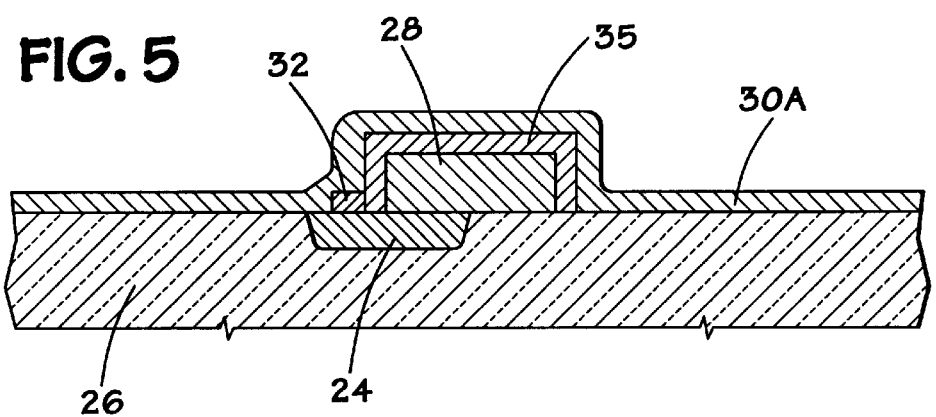
FIG. 5 depicts the semiconductor structure of FIG. 4 after deposition of a chalcogenide layer thereon, illustrated in vertical section.
Figure 6:
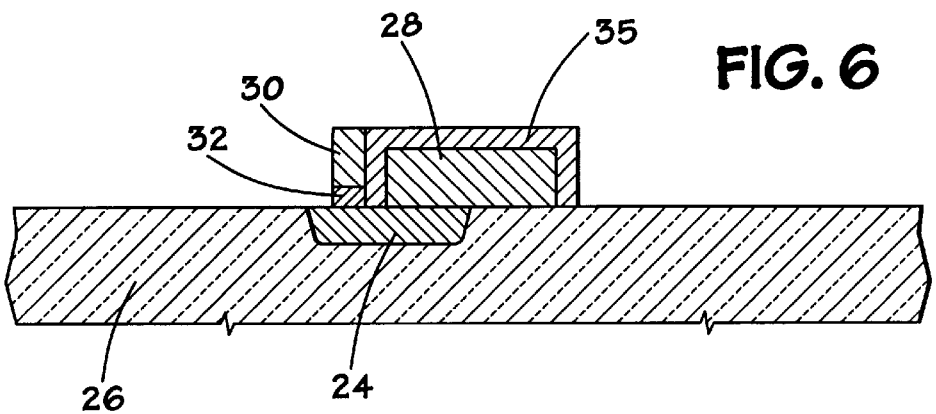
FIG. 6 depicts the semiconductor structure of FIG. 5 after removal of the horizontal portions of the chalcogenide layer, illustrated in vertical section.

After the electrode 32 and the insulating layer 35 have been deposited, a layer of chalcogenide material 30A is deposited over the electrode 32 and the insulating layer 35, as illustrated in FIG. 5. A portion of the layer of chalcogenide material 30A is removed to form the chalcogenide element 30, as illustrated in FIG. 6. The chalcogenide material may be removed by an appropriate etch, such as RIE with HBr. This etch is anisotropic at low pressure. As a result material is removed from unprotected horizontal surfaces while remaining on vertical surfaces. The pattern for removing the portions of chalcogenide material to form multiple chalcogenide elements 30 along the length of the mesa-shaped P region 28 is illustrated in FIG. 7.

Various types of chalcogenide materials may be used to form the chalcogenide elements 30. For example, chalcogenide alloys may be formed from tellurium, antimony, germanium, selenium, bismuth, lead, strontium, arsenic, sulfur, silicon, phosphorous, and oxygen. Advantageously, the particular alloy selected should be capable of assuming at least two generally stable states in response to a stimulus, for a binary memory, and capable of assuming multiple generally stable states in response to a stimulus, for a higher order memory. Generally speaking, the stimulus will be an electrical signal, and the multiple states will be different states of crystallinity having varying levels of electrical resistance. Alloys that may be particularly advantageous include tellurium, antimony, and germanium having approximately 55 to 85 percent tellurium and 15 to 25 percent germanium, such as $Te_{56}Ge_{22}Sb_{22}$.

Once the individual chalcogenide elements 30 have been formed, the conductive material to form the row line 16 may be deposited onto the mesa-shaped P region 28 so that it is coupled to the diode which forms the access device 22. Thereafter, the layer of dielectric material 36 may be deposited over the structure to provide the appropriate electrical insulation between the plurality of newly formed memory cells 14. The dielectric material 36 is patterned and contact holes 42 are etched in the dielectric layer 36. Conductive material is then deposited over the dielectric layer 36 to fill the contact holes 42. The excess conductive material is then removed to form the individual plug electrodes 34. Subsequently, the column lines 18 are deposited over the dielectric layer 36 to contact the appropriate plug electrodes 34 in the respective columns.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A memory cell comprising:
    a semiconductor substrate having a doped region;
    a doped semiconductive structure disposed on said semiconductor substrate, said doped semiconductive structure having a sidewall positioned adjacent said doped region so that said doped semiconductive structure partially overlaps said doped region to create a diode;
    a layer of insulating material disposed on said sidewall of said doped semiconductive structure;
    a first layer of conductive material disposed on said doped region adjacent said layer of insulating material to form a first electrode;
    a layer of structure changing material disposed on said first electrode; and
    a second layer of conductive material disposed on said layer of structure changing material to form a second electrode.

2. The memory cell, as set forth in claim 1, wherein said doped semiconductive structure comprises a layer of epitaxially grown silicon.

3. The memory cell, as set forth in claim 1, wherein said structure changing material comprises a chalcogenide material.

4. The memory cell, as set forth in claim 1, further comprising a layer of dielectric material being disposed on said layer of structure changing material.

5. The memory cell, as set forth in claim 4, wherein said layer of dielectric material has a contact hole formed therein, said contact hole extending to said layer of structure changing material, and wherein said second layer of conductive material is disposed in said contact hole to form said second electrode.

6. A memory array comprising:
    a plurality of memory cells, each memory cell comprising:
        a semiconductor substrate having a doped region;
        a doped semiconductive structure disposed on said semiconductor substrate, said doped semiconductive structure having a sidewall positioned adjacent said doped region so that said doped semiconductive structure partially overlaps said doped region to create a diode;
        a layer of insulating material disposed on said sidewall of said doped semiconductive structure;
        a first layer of conductive material disposed on said doped region adjacent said layer of insulating material to form a first electrode;
        a layer of structure changing material disposed on said first electrode adjacent said layer of insulating material;
        a second layer of conductive material disposed on said layer of structure changing material to form a second electrode; and
    a grid coupled to said plurality of memory cells, said grid formed by a first plurality of conductive lines generally extending in a first direction and a second plurality of conductive lines generally extending in a second direction.

7. The memory array, as set forth in claim 6, wherein said structure changing material comprises a chalcogenide material.

8. The memory array, as set forth in claim 6, wherein each of said plurality of memory cells further comprises a layer of dielectric material being disposed on said layer of structure changing material.

9. The memory array, as set forth in claim 8, wherein said layer of dielectric material has a contact hole formed therein, said contact hole extending to said layer of structure changing material, and wherein said second layer of conductive material is disposed in said contact hole to form said second electrode.

10. The memory array, as set forth in claim 6, wherein said plurality of memory cells are arranged in a plurality of generally perpendicular rows and columns.

11. The memory array, as set forth in claim 10, wherein each of said first plurality of conductive lines are coupled to memory cells in a respective row, and wherein each of said second plurality of conductive lines are coupled to memory cells in a respective column.

* * * * *